United States Patent
Nagaso et al.

(10) Patent No.: US 6,917,317 B2
(45) Date of Patent: Jul. 12, 2005

(54) SIGNAL PROCESSING DEVICE, SIGNAL PROCESSING METHOD, DELTA-SIGMA MODULATION TYPE FRACTIONAL DIVISION PLL FREQUENCY SYNTHESIZER, RADIO COMMUNICATION DEVICE, DELTA-SIGMA MODULATION TYPE D/A CONVERTER

(75) Inventors: Yoichi Nagaso, Yawata (JP); Takaharu Saeki, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/495,863

(22) PCT Filed: Aug. 27, 2003

(86) PCT No.: PCT/JP03/10885

§ 371 (c)(1),
(2), (4) Date: May 18, 2004

(87) PCT Pub. No.: WO2004/023661

PCT Pub. Date: Mar. 18, 2004

(65) Prior Publication Data

US 2005/0017887 A1 Jan. 27, 2005

(30) Foreign Application Priority Data

Sep. 5, 2002 (JP) ........................................ 2002-260088

(51) Int. Cl.$^7$ ................................................. H03M 1/20
(52) U.S. Cl. ..................... 341/131; 341/143; 341/144
(58) Field of Search ............................ 341/143, 144, 341/131, 118, 120

(56) References Cited

U.S. PATENT DOCUMENTS

| 5,070,310 | A | | 12/1991 | Hietala et al. |
| 6,016,113 | A | * | 1/2000 | Binder ........................ 341/131 |
| 6,150,969 | A | * | 11/2000 | Melanson .................... 341/143 |
| 6,734,741 | B2 | * | 5/2004 | Staszewski et al. ........ 331/36 C |
| 6,823,033 | B2 | * | 11/2004 | Fahim ........................ 375/376 |

FOREIGN PATENT DOCUMENTS

| JP | 2-25116 A | 1/1990 |
| JP | 3-504790 | 10/1991 |
| JP | 5-284033 A | 10/1993 |
| JP | 2001-237709 A | 8/2001 |
| JP | 2002-152044 A | 5/2002 |
| WO | WO 89/12362 | 12/1989 |

* cited by examiner

Primary Examiner—Michael Tokar
Assistant Examiner—Linh V. Nguyen
(74) Attorney, Agent, or Firm—McDermott Will & Emery LLP

(57) ABSTRACT

A fractional frequency divider (28) includes a latch (31) for holding frequency division data, a ΔΣ modulator (33), a digital dither circuit (32) for receiving a digital input F representing fraction part of the frequency division data from the latch (31) and supplying a digital output alternately changing between F+k and F−k (where k is an integer) or a F value itself to the ΔΣ modulator (33), and circuit means (34 through 38) for executing fractional frequency division based on integer part (M value) of the frequency division data and an output of the ΔΣ modulator (33). The digital dither circuit (32) is useful for suppressing a spurious signal generated as a result of concentration of quantization noise at a particular frequency when the ΔΣ modulator (33) receives a particular F value (e.g., $F=2^{n-1}$).

9 Claims, 6 Drawing Sheets

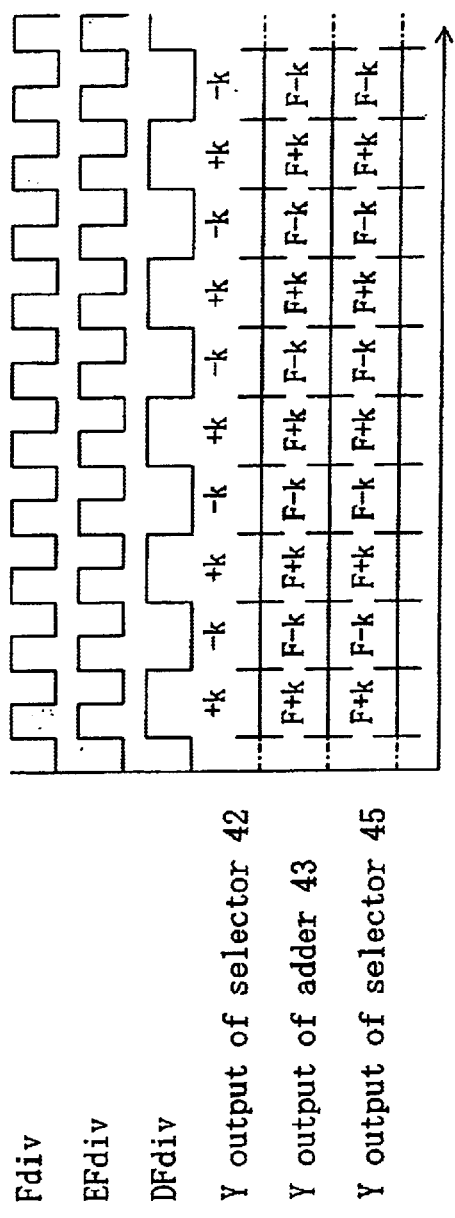
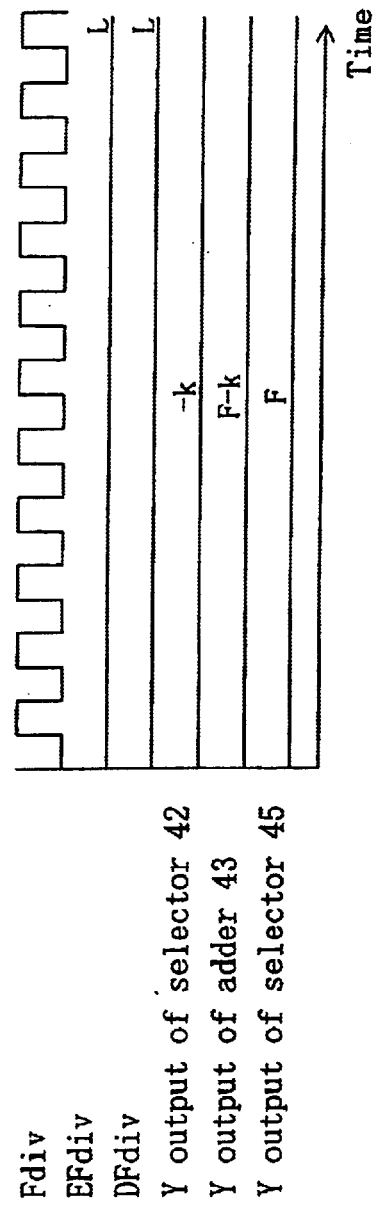
FIG. 4A
FIG. 4B

US 6,917,317 B2

SIGNAL PROCESSING DEVICE, SIGNAL PROCESSING METHOD, DELTA-SIGMA MODULATION TYPE FRACTIONAL DIVISION PLL FREQUENCY SYNTHESIZER, RADIO COMMUNICATION DEVICE, DELTA-SIGMA MODULATION TYPE D/A CONVERTER

RELATED APPLICATION

This application is a 371 of PCT/JP03/10885 filed on Aug. 27, 2003.

TECHNICAL FIELD

The present invention relates to a signal processing device, a signal processing method, a delta-sigma modulation type fractional frequency division PLL frequency synthesizer, a radio communication device and a delta-sigma modulation type D/A converter.

BACKGROUND ART

A delta-sigma ($\Delta\Sigma$) modulator has a circuit configuration which performs feedback of quantization noise generated in an output to an input via a delayer and sometimes is called "sigma-delta ($\Sigma\Delta$) modulator" or "noise shaper" because of its function of biasing quantization noise to the high frequency band.

When a frequency synthesizer including a phase locked loop (PLL) is used for a radio communication device such as a cellular phone, in order to ensure many available bands, it is required to change an output frequency with a smaller step size than the frequency of a reference signal. As a frequency synthesizer to meet this requirement, a $\Delta\Sigma$ modulation fractional frequency division PLL frequency synthesizer has been known. An exemplary $\Delta\Sigma$ modulation fractional frequency division PLL frequency synthesizer is described in U.S. Pat. No. 5,070,310. In the PLL frequency synthesizer, a fractional frequency divider for frequency-dividing an output of a voltage control oscillator to feedback the output to a phase comparator includes a $\Delta\Sigma$ modulator and a digital value F representing fraction part (non-integer part) of frequency division data is given to the $\Delta\Sigma$ modulator.

Moreover, a high accuracy digital/analog (D/A) converter including a $\Delta\Sigma$ modulator, i.e., a $\Delta\Sigma$ modulation D/A converter is used for an audio device and the like.

DISCLOSURE OF INVENTION

With the $\Delta\Sigma$ modulation fractional frequency division PLL frequency synthesizer, assuming that the frequency of the reference signal given to the phase comparator is Fref and the digital value F representing fraction part of the frequency divided data is binary data of n (n is an integer), an output frequency step size equal to Fref×(F/$2^n$) can be achieved. However, it has been pointed out as a problem that as a result of concentration of quantization noise at a particular frequency when the $\Delta\Sigma$ modulator receives a particular F value (e.g., F=$2^{n-1}$), a spurious signal is generated. Then, in a known manner, n takes a large value (Fref=26 MHz, n=24 in the above-described United State Patent) and F, which may be a problem, is substituted by F+1 or F−1. Accordingly, two problems, i.e., (1) a problem in which circuit scale is increased and (2) a problem in which an output frequency is slightly shifted from a desired frequency, arise.

With a $\Delta\Sigma$ modulation D/A converter, spurious problems arise such as those described above, which depends on a digital input of $\Delta\Sigma$ modulator.

An object of the present invention is to suppress concentration of quantization noise at a particular frequency.

To achieve the above-described object, the present invention uses a signal processing device which has a configuration including, in addition to a delta-sigma modulator, a dither circuit, located between a digital input and the delta-sigma modulator, for selectively supplying a digital signal which has been discretely changed from the digital input and of which a time average corresponds to the digital input. Thus, even if a bit width of the digital input is not increased, concentration of quantization noise at a particular frequency can be suppressed.

The signal processing device can be applied to a fractional frequency division PLL frequency synthesizer, an A/D converter, a radio communication device and the like.

According to the present invention, a dither circuit, located between a digital input and the delta-sigma modulator, for selectively supplying a digital signal which has been discretely changed from the digital input and of which a time average corresponds to the digital input is adopted. Thus, even if a bit width of the digital input is not increased, concentration of quantization noise at a particular frequency can be suppressed. Therefore, a known spurious problem can be dissolved and also a desired output frequency can be obtained.

BRIEF DESCRIPTION OF DRAWINGS

FIGS. 4(a) and 4(b) are timing charts describing the operation of the digital dither circuit shown in FIG. 3.

BEST MODE FOR CARRYING OUT THE INVENTION

The Configuration of a Cellular Phone

Figure 1:
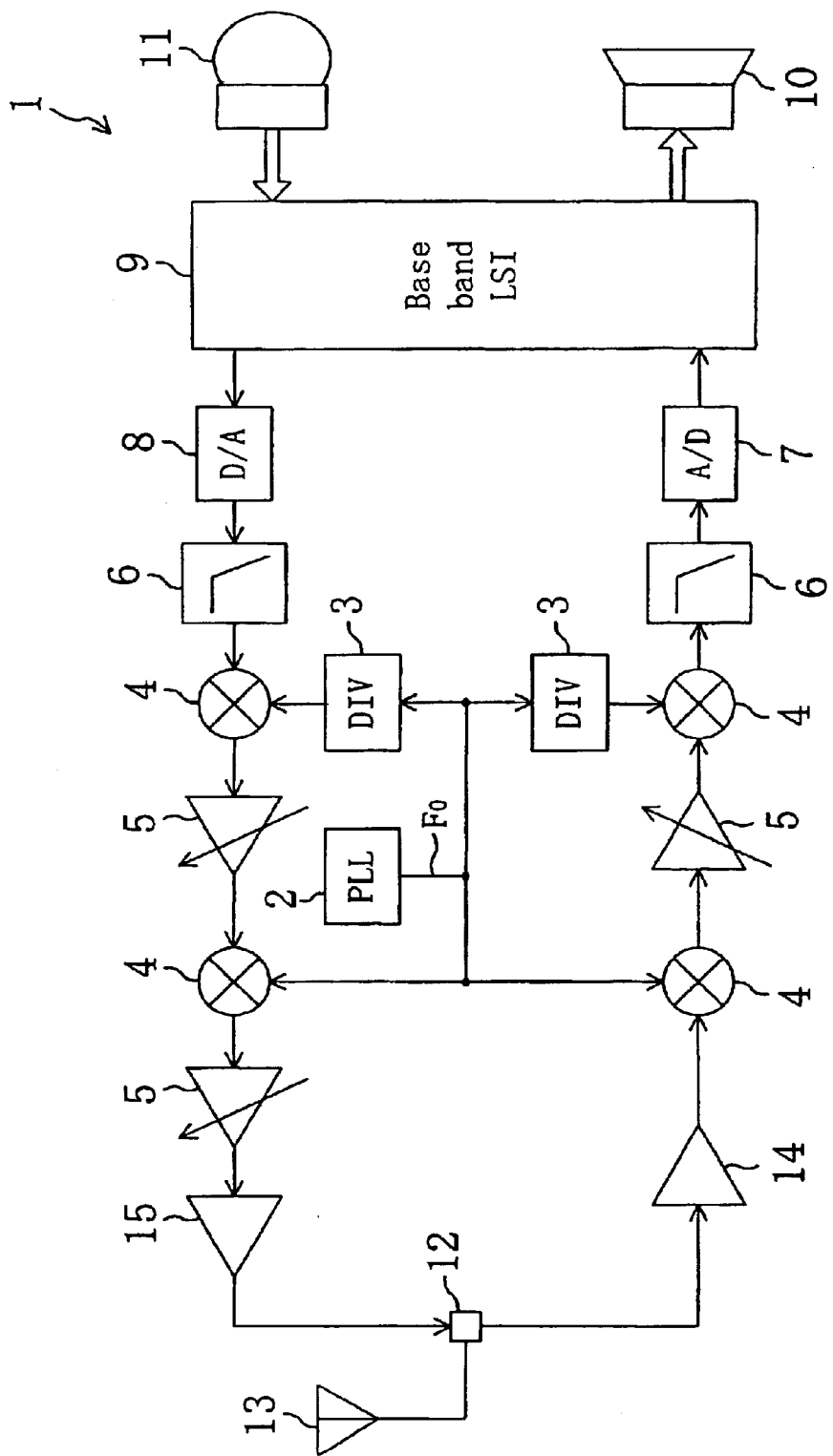
FIG. 1 is a block diagram illustrating the configuration of a cellular phone according to an embodiment of the present invention.

FIG. 1 is a block diagram illustrating a cellular phone (radio communication device) to which a $\Delta\Sigma$ modulation fractional frequency division PLL frequency synthesizer according to the present invention is applied. The cellular phone shown in FIG. 1 includes a $\Delta\Sigma$ modulation fractional frequency division PLL frequency synthesizer 2, a frequency divider (DIV) 3, a modulator/demodulator (mixer) 4, a gain control amplifier (GCA) 5, a low-pass filter (LPF) 6, an analog/digital (A/D) converter 7, an digital/analog (D/A) converter 8, a base band LSI 9, a speaker 10, microphone 11, a changing switch 12, an antenna 13, a low noise amplifier 14 and a driver amplifier 15. Fo denotes an output signal of the $\Delta\Sigma$ modulation fractional frequency division PLL frequency synthesizer.

The Configuration of the PLL Frequency Synthesizer 2

Figure 2:
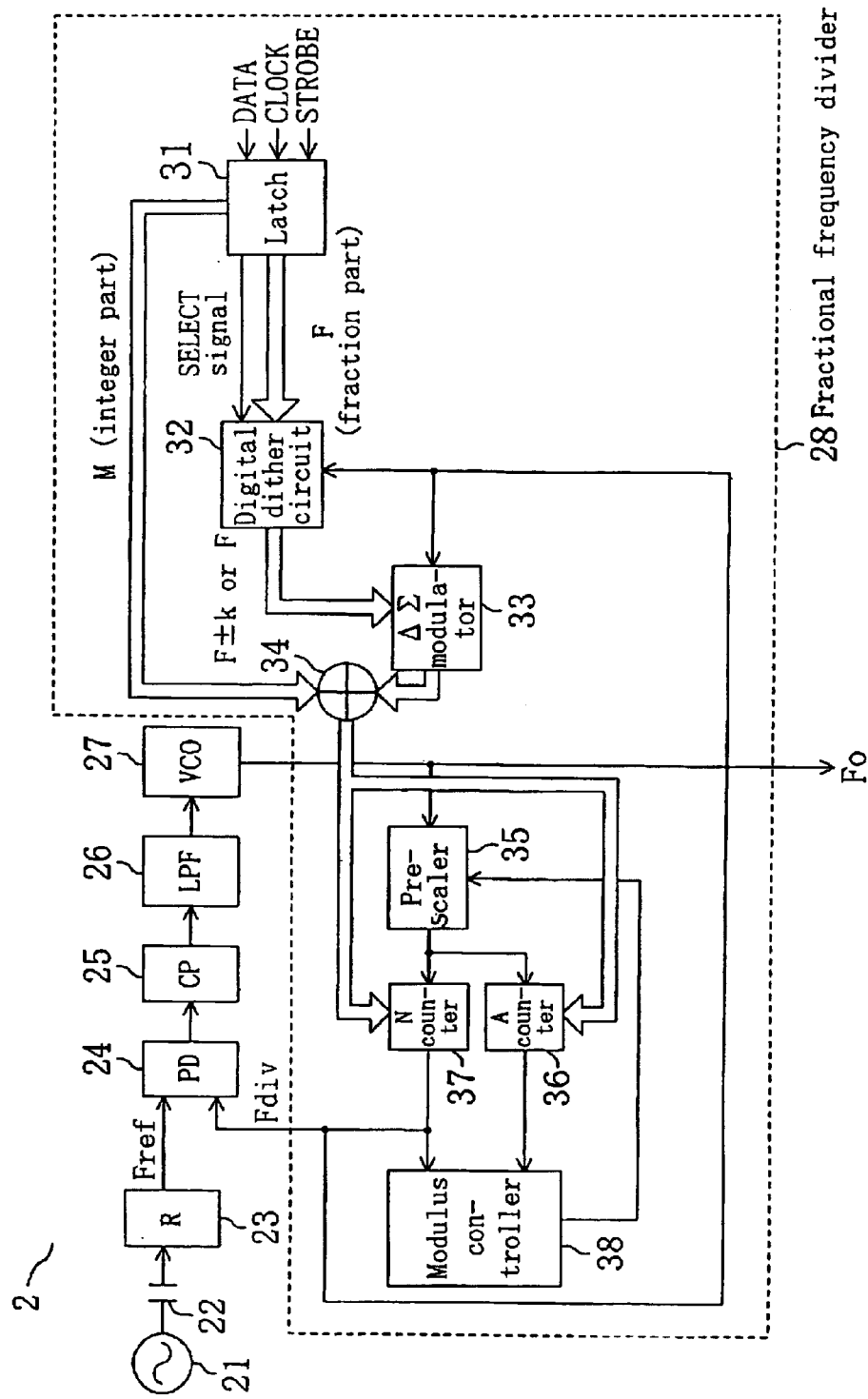
FIG. 2 is a block diagram illustrating the internal configuration of a $\Delta\Sigma$ modulation fractional frequency division PLL frequency synthesizer shown in FIG. 1.

FIG. 2 is a block diagram illustrating an internal configuration of the $\Delta\Sigma$ modulation fractional frequency division PLL frequency synthesizer 2 of FIG. 1. Referring to FIG. 2, the PLL frequency synthesizer 2 includes a reference frequency source 21, a coupling capacitor 22, a reference frequency divider (R) 23, a phase comparator (PD) 24, a charging pump (CP) 25, a low-pass filter (LPF) 26, a voltage control oscillator (VCO) 27, and a fractional frequency divider 28. The phase comparator 24, the charging pump 25, the low-pass filter 26, the voltage control oscillator 27 and the fractional frequency divider 28 together form a phase locked loop (PLL). The fractional frequency divider 28 is a pulse swallow frequency divider and includes a latch 31, a digital dither circuit 32, a ΔΣ modulator 33, an adder 34, a prescaler 35, an A counter 36, an N counter 37, and a modulus controller 38.

The Operation of the PLL Frequency Synthesizer 2

In the ΔΣ modulation fractional frequency division PLL frequency synthesizer 2 of FIG. 2, the fractional frequency divider 28 performs frequency division of an output signal Fo of the voltage control oscillator 27. A comparative signal Fdiv obtained through the frequency division is returned to the phase comparator 24. The phase comparator 24 detects a phase difference between the reference signal Fref and the comparative signal Fdiv and gives a voltage pulse having a pulse width according to the phase difference to the charging pump 25. The charging pump 25 becomes in one of three states, i.e., a state in which a current is discharged, a state in which a current is drawn, and a state in which impedance is high, according to an output of the phase comparator 24 and gives a charging pump output current to the low-pass filter 26. The charging pump output current is smoothed and voltage-converted by the low-pass filter 26 to be a control voltage of the voltage control oscillator 27.

The Operation of the Fractional Frequency Divider 28

Next, the operation of the fractional frequency divider 28 of FIG. 2 will be described. (P+1) frequency division by the prescaler 35 is executed to the output signal Fo of the voltage control oscillator 27 and then is received by the A counter 36 and N counter 37. The A counter 36 counts the output signal Fo of the voltage control oscillator 27, which has been (P+1) frequency-divided, at A times and then outputs a pulse. In response to this, the modulus controller 38 changes a frequency division number for the prescaler 35 from (P+1) to P. Next, the N counter 37 counts the output signal Fo of the voltage control oscillator 27, which has been P frequency-divided, at (N−A) times and then outputs a pulse to the phase comparator 24 and the modulus controller 38. In response to this, the frequency division number of the prescaler 35 is changed to (P+1).

The frequency division number of the output signal Fo of the voltage control oscillator 27 is (P+1)×A until the A counter 36 outputs an output and is P×(N−A) until the N counter 37 outputs an output. Therefore, if respective frequencies of an output signal and a reference signal are assumed to be Fo and Fref, the following equation holds.

$$Fo = ((P+1) \times A + P \times (N-A)) \times Fref \quad \text{[Equation 1]}$$
$$= (P \times N + A) \times Fref$$

Even when $P=2^n$ (n is an integer), the number of available bands can be increased by changing A in Equation 1.

To further increase the number of available bands, the ΔΣ modulator 33 is provided. Moreover, to dissolve the spurious problem, the digital dither circuit 32 is provided between the latch 31 and the ΔΣ modulator 33. The latch 31 holds given frequency division data DATA. Note that in FIG. 2, CLOCK denotes a clock signal and STROBE denotes a strobe signal. The frequency division data DATA includes a digital value M representing integer part and a digital value F representing fraction part (non-integer part). The F value is an n bit binary data. The digital dither circuit 32 receives the F value from the latch 31 and supplies a digital output which has been discretely changed from the F value and of which the time average corresponds to the F value or the F value as it is to the ΔΣ modulator 33 according to a SELECT signal. Specifically, when the SELECT signal is low, the F value, as it is, is supplied to the ΔΣ modulator 33. When the SELECT signal is high, the digital output to be supplied to the ΔΣ modulator 33 is periodically changed to F+k or F−k (k is an integer, e.g., 1). Then, based on an M value given by the latch 31 and the output of the ΔΣ modulator 33, fractional frequency division by the prescaler 35, the A counter 36 and the N counter 37 is executed. As a result, whether or not the SELECT signal exists, the following equation holds.

$$Fo = ((P \times N + A) + F/2^n) \times Fref \quad \text{[Equation 2]}$$

Thus, an output frequency step size equal to $Fref \times (F/2^n)$ is achieved. That is, in a normal operation state, an average frequency Fo of an output signal can be changed with a smaller step size than the frequency Fref of the reference signal, so that the reference frequency Fref can be set at a large level. Thus, a PLL frequency synthesizer having excellent lockup characteristics can be obtained.

The Internal Configuration and Operation of the Digital Dither Circuit 32

Figure 3:
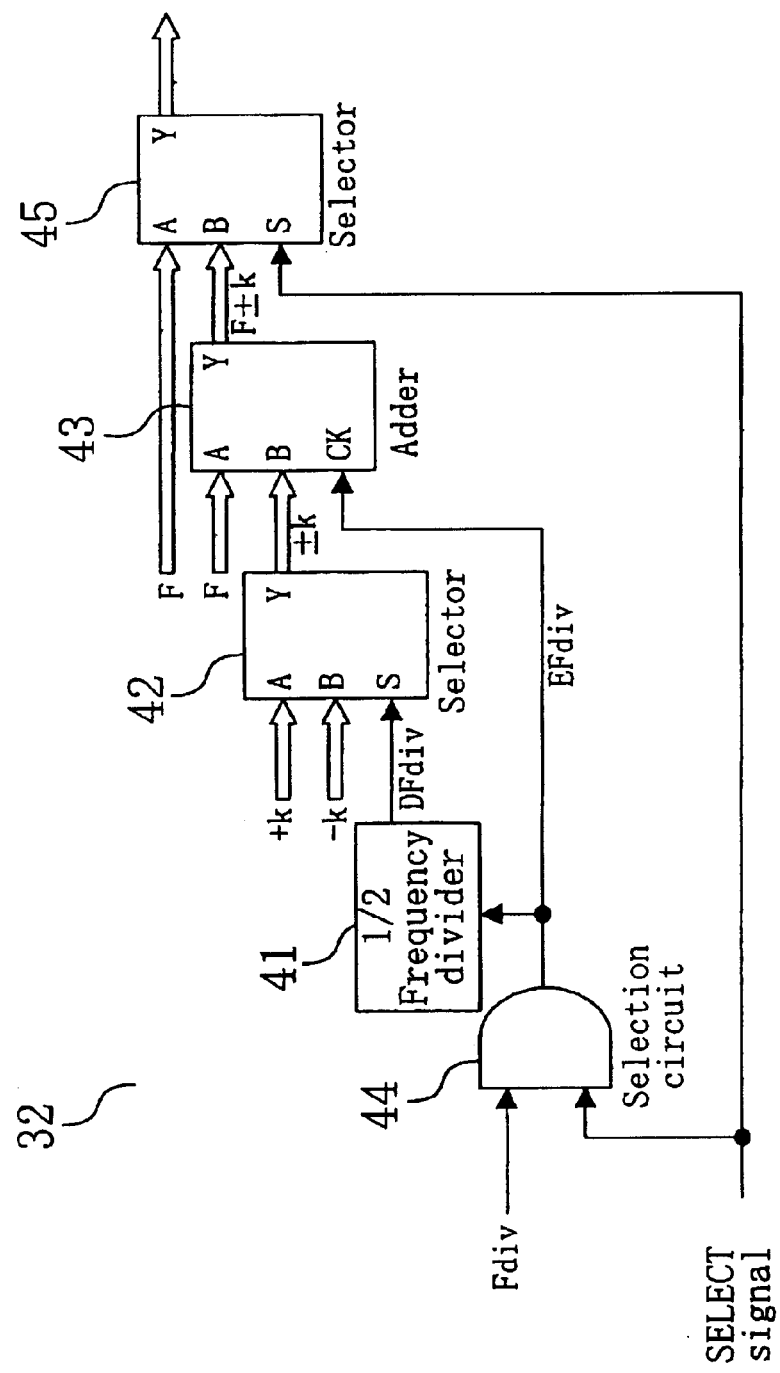
FIG. 3 is a block diagram illustrating the internal configuration of a digital dither shown in FIG. 2.

FIG. 3 is a block diagram illustrating the internal configuration of the digital dither circuit 32 of FIG. 2. Referring to FIG. 3, the digital dither circuit 32 includes a ½ frequency divider 41, selectors 42 and 45, an adder 43, and a selection circuit 44.

The selection circuit 44 outputs Fdiv as EFdiv when the SELECT signal is high, and outputs a fixed value as EFdiv when the SELECT signal is low.

The ½ frequency divider 41 generates a clock signal DFdiv having a half frequency of a frequency of the comparative signal EFdiv from the selection circuit 44.

The selector 42 receives a clock signal DFdiv from the ½ frequency divider 41 at an S input, and selects a positive constant value or a negative constant value alternately in a manner in which a positive constant value [+k (A input)] is selected when the logic level of the S input is low, and a negative constant value [−k (B input)] is selected when the logic level of the S input is high.

The adder 43 receives the F value from the latch 31 at the A input and the constant value [±k] from the selector 42 at the B input, and performs addition operation A+B when a rise pulse of the comparator signal EFdiv is given as a CK input to periodically change a Y output to F+k or F−k.

The selector 45 receives the F value from the latch 31 at the A input, the Y output from the adder 43 at the B input, and the SELECT signal at the S input. The selector 45 selects the F value (A input) when the logic level of the S signal, i.e., the SELECT signal is low, and selects as the Y output the Y output (B input) of the adder 43 when the logic level of the SELECT signal is high.

As has been described, the Y output of the selector 45, i.e., F+k or F is finally supplied to the ΔΣ modulator 33 by the SELECT signal. Change of the SELECT signal will be described later. FIGS. 4(a) and 4(b) illustrate the operation of the digital dither circuit 32.

Simulation Results for Quantization Noise

Figure 5:
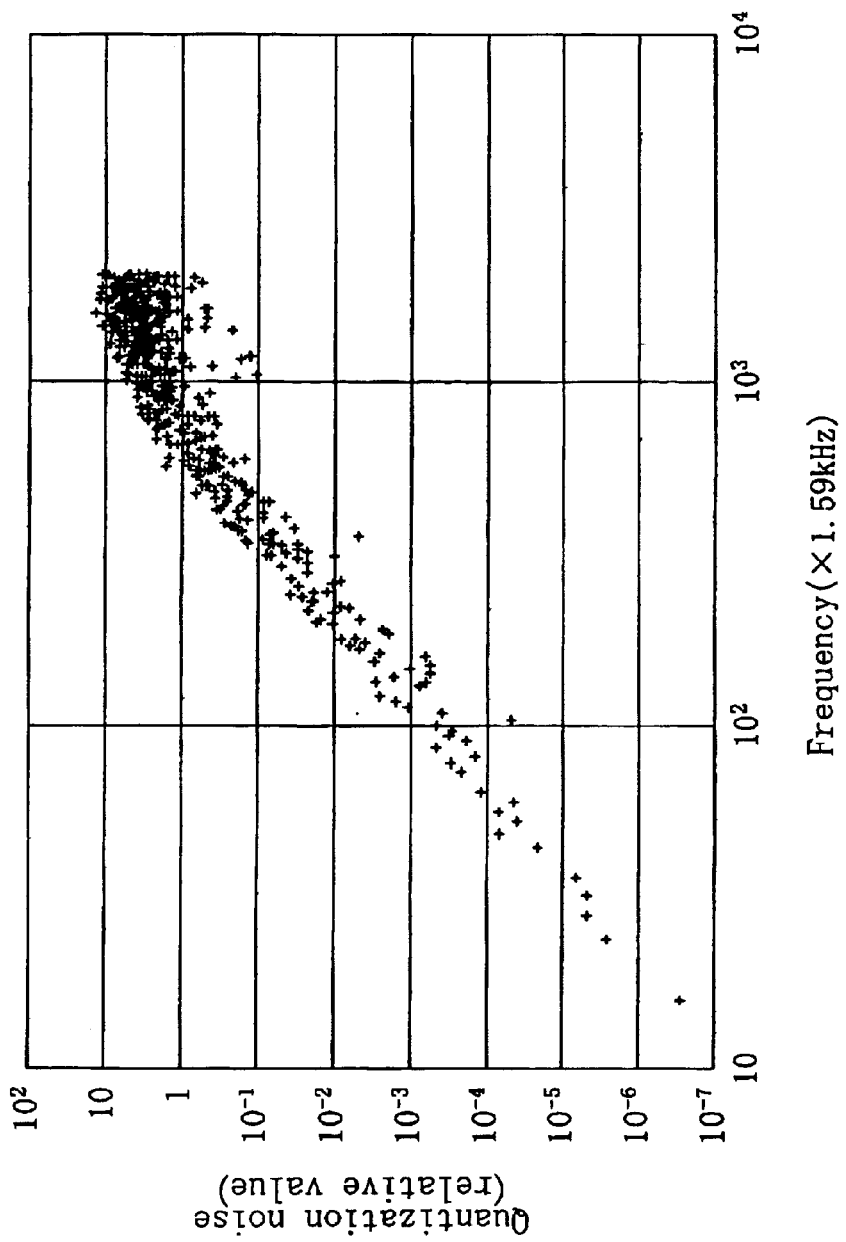
FIG. 5 is a graph showing simulation results for quantization noise in the $\Delta\Sigma$ modulation fractional frequency division PLL frequency synthesizer of FIG. 2.

FIG. 5 is a graph showing simulation results for quantization noise in the ΔΣ modulation fractional frequency division PLL frequency synthesizer of FIG. 2. In this case, assuming that Fref=6.5 MHz, M=778, F=128, n=8, and k=1, a second order two-stage modulator is used as the ΔΣ modulator 33.

From FIG. 5, it can be seen that frequency-response characteristics of quantization noise are inclined and quantization noise in the low frequency band is reduced, compared to the case where no ΔΣ modulation is executed. The time average of frequency division number in the fractional frequency divider 28 is 778.5, which totally corresponds to a desired frequency division number. Furthermore, no concentration of quantization noise in a particular frequency number is not caused. If it is taken into consideration that when the digital dither circuit 32 is not provided and the F value (=128=$2^7$), as it is, is given to the ΔΣ modulator 33, a large spectrum appears around 800 kHz, great effects of the digital dither circuit 32 can be achieved.

Modified Example

Note that the configuration of the digital dither circuit 32 is not limited to that of FIG. 3. The digital dither circuit 32 may have a circuit configuration in which according to the given F value, (1) the F value as it is or (2) a value which has been obtained by randomly obtaining F+k and F−k in unspecific periodical intervals and of which the time average corresponds to the time average of the F value is transmitted to the ΔΣ modulator 33.

SELECT Signal Change

SELECT signal change is performed so as to randomly obtain F+k and F−k in unspecific periodical intervals and output a digital signal of which the time average corresponds to the F value to the ΔΣ modulator 33 only when the F value is a particular value (e.g., F=$2^{n-1}$, $2^{n-2}$ and so on), and the F value itself to the ΔΣ modulator 33 when the F value is a value other than the particular value in order to suppress spurious which occurs as a result of concentration of quantization noise in a particular frequency. Specifically, the SELECT signal is changed to be high when the given F value is a particular value and the SELECT signal is changed to low when the given F value is a value other than the particular value. As a result, the digital dither circuit 32 outputs a digital value which has been discretely changed from the F value and of which the time average corresponds to the F value to the ΔΣ modulator 33 only when the given F value is the particular value (e.g., F=$2^{n-1}$, $2^{n-2}$ and so on), and outputs the F value, as it is, to the ΔΣ modulator 33 when the given F value is a value other than the particular value. Thus, the generation of spurious to an output of the voltage control oscillator 27 in a particular frequency division ration is suppressed, so that the same characteristics as those of the known ΔΣ modulation D/A converter can be achieved in a frequency division ratio other than the particular frequency division ratio.

The Configuration of a ΔΣ Modulation D/A Converter

Figure 6:
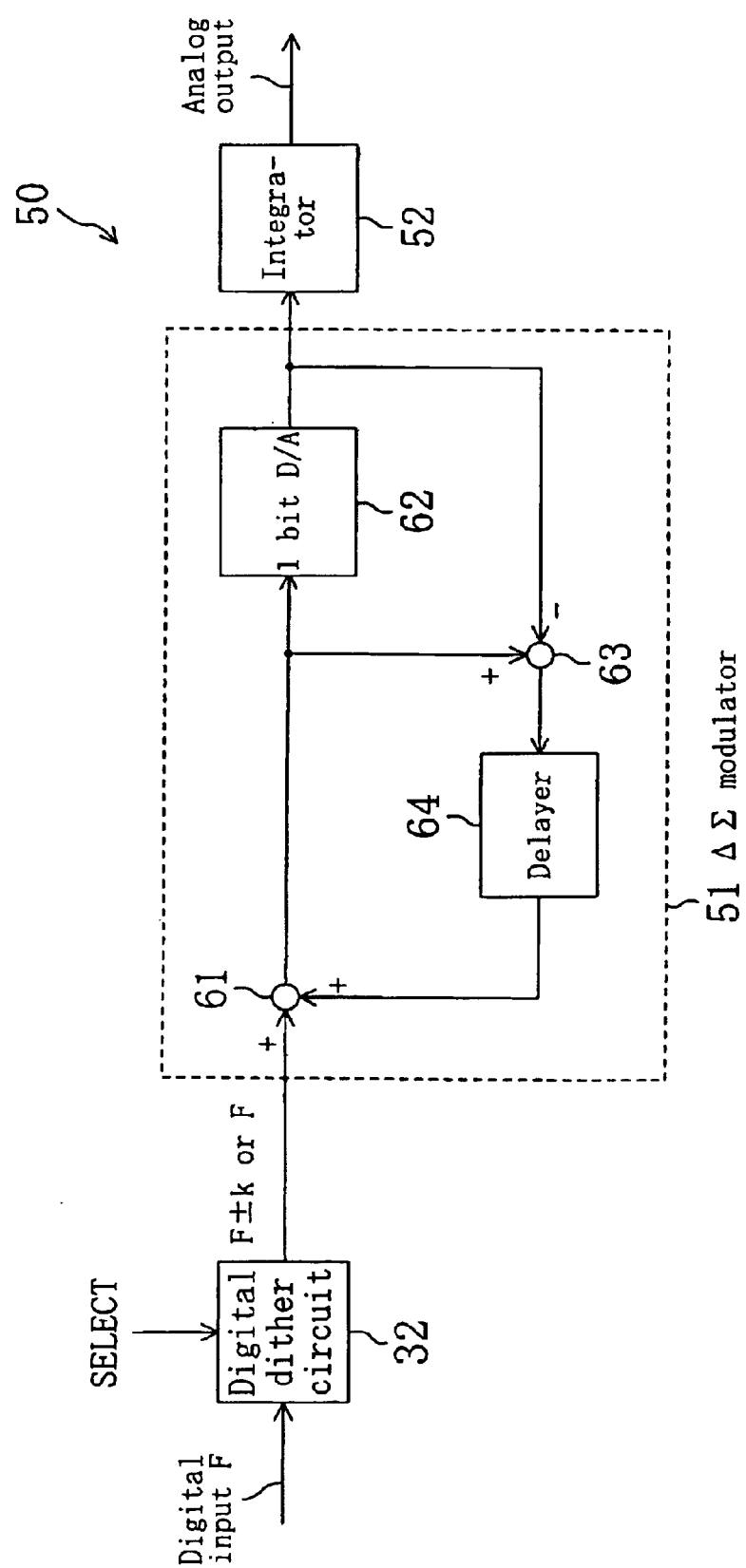
FIG. 6 is a block diagram illustrating the configuration of a $\Delta\Sigma$ modulation type D/A converter according to an embodiment of the present invention.

FIG. 6 illustrates an exemplary configuration of a ΔΣ modulation D/A converter according to the present invention. A ΔΣ modulation D/A converter 50 shown in FIG. 6 is a ΔΣ modulation D/A converter obtained by additionally providing the digital dither circuit 32, for example, having the same configuration of FIG. 3 in the previous stage of a known D/A converter including a ΔΣ modulator 51 and an integrator 52. The ΔΣ modulator 51 includes an adder 61, a 1 bit D/A converter 62, a subtracter 63, and a delayer 64. The integrator 52 is filter means for removing quantization noise contained in an output of the ΔΣ modulator 51 to obtain a desired analog output, and is also called "postfilter". The digital dither circuit 32 is provided between a digital input and the ΔΣ modulator 51 and selectively supplies a digital signal which has been discretely changed from the digital input F and of which the time average corresponds to the digital input F or the digital input F as it is to the ΔΣ modulator 51, according to the SELECT signal. Note that a clock signal to be supplied to each member is not shown.

With the ΔΣ modulation D/A converter 50 of FIG. 6, even if the bit width of the digital input F of the ΔΣ modulator 51 is not increased, a spurious problem depending on the digital input F of the ΔΣ modulator 51 can be dissolved.

What is claimed is:

1. A signal processing device characterized by comprising:
   a delta-sigma modulator; and
   a digital dither circuit, provided between the digital input and the delta-sigma modulator, for selectively supplying to the delta-sigma modulator a digital output which has been discretely changed from a digital input and of which a time average corresponds to the digital input or the digital input, according to a value for the digital input.

2. The signal processing device of claim 1, characterized in that the delta-sigma modulator supplies the digital output which has been discretely changed from the digital input and of which a time average corresponds to the digital input when the digital input is a particular value, and
   supplies the digital input to the delta-sigma modulator when the digital input is a value other than the particular value.

3. The signal processing device of claim 1, characterized in that the digital dither circuit supplies, as the digital output which has been discretely changed from the digital input and of which a time average corresponds to the digital input, a signal which periodically changes to F+k or F−k (where F is a value for the digital input and k is an integer) to the delta-sigma modulator.

4. The signal processing device of claim 3, characterized in that k is 1.

5. A signal processing method characterized in that when a given digital input is a particular value, a digital output which has been discretely changed from the digital input and of which a time average corresponds to the digital input is supplied to a delta-sigma modulator, and
   when the digital input is a value other than the particular value, the digital input is supplied to the delta-sigma modulator.

6. A delta-sigma modulation type fractional frequency division PLL frequency synthesizer which includes a phase locked loop (PLL) having a fractional frequency divider, the synthesizer characterized in that the fractional frequency divider includes
   a latch for holding given division data,
   a delta-sigma modulator,
   a digital dither circuit, provided between the latch and the delta-sigma modulator, for receiving a digital input representing fraction part of the frequency division data from the latch and selectively supplying to the delta-sigma modulator a digital output which has been discretely changed from the digital input and of which a time average corresponds to the digital output or the digital input, according to a value for the digital input, and circuit means for executing a fractional frequency division based on integer part of the frequency division data and an output of the delta-sigma modulator.

7. The delta-sigma modulation type fractional frequency division PLL frequency synthesizer of claim 6, characterized in that the digital dither circuit includes a ½ frequency divider for generating a clock signal having a half frequency of a frequency of an output signal of the fractional frequency divider, a first selector for alternately selecting, where an integral value is k, a positive constant value [+k] or a negative constant value [−k], in response to a logic level change of a clock signal from the ½ frequency divider, an adder for adding a value for a digital input from the latch circuit and a constant value selected by the selector, and a second selector for outputting a result from the addition by the adder when a value for a digital input from the latch circuit is a particular value and outputting a digital input from the latch circuit when a value of a digital input from the latch circuit is a value other than the particular value.

8. A radio communication device characterized by comprising the delta-sigma modulation type fractional frequency division PLL frequency synthesizer of claim 6.

9. A delta-sigma modulation type D/A converter characterized by comprising:

a delta-sigma modulator;

a digital dither circuit, provided between the digital input and the delta-sigma modulator, for selectively supplying to the delta-sigma modulator a digital output which has been discretely changed from a digital input and of which a time average corresponds to the digital input or the digital input, according to a value for the digital input; and filter means for removing quantization noise contained in an output of the delta-sigma modulator to obtain a desired analog output.

* * * * *